(12) United States Patent
Hatsukawa

(10) Patent No.: US 8,928,002 B2
(45) Date of Patent: Jan. 6, 2015

(54) SEMICONDUCTOR DEVICE AND METHOD OF MANUFACTURING SEMICONDUCTOR DEVICE

(71) Applicant: Sumitomo Electric Industries, Ltd., Osaka-shi (JP)

(72) Inventor: Satoshi Hatsukawa, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 36 days.

(21) Appl. No.: 13/902,180

(22) Filed: May 24, 2013

(65) Prior Publication Data

US 2014/0001482 A1  Jan. 2, 2014

Related U.S. Application Data

(60) Provisional application No. 61/665,750, filed on Jun. 28, 2012.

(30) Foreign Application Priority Data

Jun. 28, 2012 (JP) ................................ 2012-145086

(51) Int. Cl.
  *H01L 29/15* (2006.01)
  (Continued)

(52) U.S. Cl.
  CPC ............ *H01L 23/48* (2013.01); *H01L 27/0203* (2013.01); *H01L 25/072* (2013.01);
  (Continued)

(58) Field of Classification Search
  USPC ................. 257/76, 88, 89, 40, 642–643, 759,
  257/E21.05, E51.011–E51.052,
  257/E25.008–E25.009, 81, 82, 91, 98–100,
  257/116, 117, 432–437, 749,
  257/E33.056–E33.059, E25.032, E23.039,
  257/E27.015, E27.017, E27.03–E27.032,
  257/E27.109, E29.194–E29.225, 163–166,
  257/197, 205, 273, 351, 361, 378, 423, 427,
  257/474, 477, 517, 526, 539, 544, 565–593,
  257/928, E51.004, E31.069,
  257/E27.019–E27.023, E27.037–E27.043,
  257/E27.053–E27.058, E27.074–E27.078,
  257/E27.106, E27.149, E29.03–E29.035,
  257/E29.044–E29.045, E29.114, E29.124,
  257/E29.027–E29.028, E29.066–E29.067,
  257/E29.194–E29.202; 438/28, 29, 69, 82,
  438/99
  See application file for complete search history.

(56) References Cited

U.S. PATENT DOCUMENTS 7,365,368 B2 * 4/2008 Nishida et al. .................. 257/91
2008/0210954 A1 * 9/2008 Lee et al. ........................ 257/88
(Continued)

FOREIGN PATENT DOCUMENTS

JP  2000-311983 A  11/2000
JP  2004-095670 A   3/2004
(Continued)

OTHER PUBLICATIONS

International Search Report and Written Opinion in PCT International Application No. PCT/JP2013/063708, dated Aug. 6, 2013.

*Primary Examiner* — Dao H Nguyen
*Assistant Examiner* — Tram H Nguyen
(74) *Attorney, Agent, or Firm* — Venable LLP; Michael A. Sartori

(57) ABSTRACT

To provide a semiconductor device which allows a plurality of semiconductor chips to let a current flow uniformly therethrough and a method of manufacturing the same. The semiconductor device in accordance with one embodiment comprises a plurality of first semiconductor chips and a circuit board, mounted with the plurality of the first semiconductor chips, having first and second wiring conductors electrically connected to the plurality of first semiconductor chips. The plurality of first semiconductor chips are connected in parallel together with the first and second wiring conductors so as to construct a first parallel circuit. The plurality of first semiconductor chips are arranged on the circuit board according to an on-resistance of the plurality of first semiconductor chips so that a uniform current flows through the plurality of first semiconductor chips.

11 Claims, 11 Drawing Sheets

(51) Int. Cl.
*H01L 31/0256* (2006.01)
*H01L 27/02* (2006.01)
*H01L 25/07* (2006.01)
*H01L 25/18* (2006.01)
*H01L 21/66* (2006.01)
*H01L 23/48* (2006.01)

(52) U.S. Cl.
CPC ............... *H01L 25/18* (2013.01); *H01L 22/14* (2013.01); *H01L 2224/49175* (2013.01)
USPC .......................................................... 257/76

(56) References Cited

U.S. PATENT DOCUMENTS

| | | | |
|---|---|---|---|
| 2009/0272991 A1* | 11/2009 | Lee et al. | 257/91 |
| 2011/0210352 A1* | 9/2011 | Lee et al. | 257/93 |
| 2012/0305951 A1* | 12/2012 | Sakai et al. | 257/88 |
| 2013/0105825 A1* | 5/2013 | Liu et al. | 257/88 |

FOREIGN PATENT DOCUMENTS

| | | |
|---|---|---|
| JP | 2008-187151 A | 8/2008 |
| JP | 2011-243847 A | 12/2011 |

* cited by examiner

SEMICONDUCTOR DEVICE AND METHOD OF MANUFACTURING SEMICONDUCTOR DEVICE

CROSS-REFERENCE TO RELATED APPLICATIONS

This application claims priority to Provisional Application Ser. No. 61/665,750, filed on Jun. 28, 2012 and claims the benefit of Japanese Patent Application No. 2012-145086, filed on Jun. 28, 2012, all of which are incorporated herein by reference in their entirety.

BACKGROUND

1. Field

The present invention relates to a semiconductor device and a method of manufacturing a semiconductor device.

2. Description of the Related Art

Known as a semiconductor device is one in which a plurality of semiconductor chips are connected in parallel on a circuit board (see, for example, Japanese Patent Application Laid-Open No. 2004-95670). Such a semiconductor device allows a large current to flow therethrough even when a plurality of semiconductor chips have a small rated current value.

SUMMARY

When on-resistances vary among a plurality of semiconductor chips connected in parallel in the semiconductor device, the current value flowing through the semiconductor chips fluctuates depending on their on-resistances. Hence, there is a case where a large current flows through a semiconductor chip having a small on-resistance. As a result, the semiconductor chip having the small on-resistance may let a current exceeding its rated current value flow therethrough and be broken thereby.

Therefore, in this technical field, there are demands for a semiconductor device which allows a plurality of semiconductor chips to let a current flow uniformly therethrough and a method of manufacturing the same.

The semiconductor device in accordance with one aspect of the present invention comprises a plurality of first semiconductor chips and a circuit board, mounted with the plurality of the first semiconductor chips, having first and second wiring conductors electrically connected to the plurality of first semiconductor chips. The plurality of first semiconductor chips are connected in parallel together with the first and second wiring conductors so as to construct a first parallel circuit. The plurality of first semiconductor chips are arranged on the circuit board according to an on-resistance of the plurality of first semiconductor chips so that a uniform current flows through the plurality of first semiconductor chips.

In the first parallel circuit constructed by the plurality of first semiconductor chips and first and second wiring conductors in the semiconductor device, the plurality of first semiconductor chips are arranged on the circuit board according to an on-resistance of the plurality of first semiconductor chips so that a uniform current flows through the plurality of first semiconductor chips. As a result, the plurality of first semiconductor chips allow a current to flow uniformly therethrough even when their on-resistances vary.

One embodiment may be configured such that input and output ends of the current for the first parallel circuit are opposite to each other in an arrangement direction of the plurality of first semiconductor chips in the first parallel circuit, while the first and second wiring conductors have respective resistances different from each other. When the wiring conductor on the current supply side for the plurality of first semiconductor chips in the first and second wiring conductors has a resistance greater than that of the other wiring conductor in this mode, the on-resistances of the plurality of first semiconductor chips may decrease from the input end side to the output end side in the first parallel circuit. When the wiring conductor on the current supply side for the plurality of first semiconductor chips in the first and second wiring conductors has a resistance smaller than that of the other wiring conductor, on the other hand, the on-resistances of the plurality of first semiconductor chips may increase from the input end side to the output end side in the first parallel circuit.

In this structure, substantially the same resistance may act on the current flowing through the plurality of first semiconductor chips from the input end to the output end in the first parallel circuit. As a result, the current flowing through the plurality of first semiconductor chips can be made uniform.

In one embodiment, the input and output ends of the current for the first parallel circuit may be on the same side in the arrangement direction of the plurality of first semiconductor chips in the first parallel circuit. In this mode, the on-resistances of the plurality of first semiconductor chips may decrease toward the side opposite to the input and output ends in the arrangement direction in the first parallel circuit.

In this structure, regardless of the magnitudes of resistances of the first and second wiring conductors, substantially the same resistance may act on the current flowing through the plurality of first semiconductor chips from the input end to the output end in the first parallel circuit. As a result, the current flowing through the plurality of first semiconductor chips can be made uniform.

In one embodiment, a semiconductor constituting the plurality of first semiconductor chips may be a wide-bandgap semiconductor.

The first semiconductor chips utilizing the wide-bandgap semiconductor typically have small capacities with low rated current values. This makes it necessary to connect a plurality of semiconductor chips in parallel in order for a large current to flow through the semiconductor device, for example. Therefore, a structure in which the current flowing through the plurality of semiconductor chips becomes uniform is effective in particular.

In one embodiment, the first semiconductor chip may be a diode or transistor.

One embodiment may further comprise a plurality of second semiconductor chips. The plurality of second semiconductor chips may be connected in parallel together with the first and second wiring conductors so as to construct a second parallel circuit. The plurality of second semiconductor chips are arranged on the circuit board according to an on-resistance of the plurality of second semiconductor chips so that a uniform current flows through the plurality of second semiconductor chips.

This structure allows the plurality of first semiconductor chips to let a current flow uniformly therethrough and the plurality of second semiconductor chips to let a current flow uniformly therethrough.

When the semiconductor device comprises the plurality of semiconductor chips, one of the first and second semiconductor chips may be a transistor, while the other being a diode.

The method of manufacturing a semiconductor device in accordance with another aspect of the present invention comprises the steps of inspecting an on-resistance of a plurality of first semiconductor chips; mounting the plurality of first semiconductor chips on a circuit board having a first wiring conductor and a second wiring conductor insulated from the first wiring conductor; and connecting the plurality of first semiconductor chips in parallel through the first and second wiring conductors such that the plurality of first semiconductor chips construct a first parallel circuit together with the first and second wiring conductors. In the step of mounting the plurality of first semiconductor chips, the plurality of first semiconductor chips are mounted on the circuit board according to the on-resistance of the plurality of first semiconductor chips so that a uniform current flows through the plurality of first semiconductor chips.

The above-mentioned manufacturing method can manufacture a semiconductor device in which a plurality of first semiconductor chips are arranged on a circuit board according to an on-resistance of the plurality of first semiconductor chips so that a uniform current flows through the plurality of first semiconductor chips in the first parallel circuit constructed by the plurality of first semiconductor chips and first and second wiring conductors. Since the plurality of first semiconductor chips are arranged as mentioned above, the plurality of first semiconductor chips allow a current to flow uniformly therethrough even when their on-resistances vary in this semiconductor device.

One embodiment may be configured such that the first parallel circuit has an output end of the current therefrom on a side opposite to an input end of the current thereto in an arrangement direction of the plurality of first semiconductor chips, while the first and second wiring conductors have respective resistances different from each other. In this mode, in the step of mounting the plurality of semiconductor chips, when the wiring conductor to be located on the current supply side for the plurality of first semiconductor chips in the first and second wiring conductors has a resistance greater than that of the other wiring conductor, the plurality of first semiconductor chips may be mounted on the circuit board such that the on-resistances of the plurality of first semiconductor chips decrease from the input end side to the output end side. On the other hand, when the wiring conductor to be located on the current supply side for the plurality of first semiconductor chips in the first and second wiring conductors has a resistance smaller than that of the other wiring conductor, the plurality of first semiconductor chips may be mounted on the circuit board such that the on-resistances of the plurality of first semiconductor chips increase from the input end side to the output end side.

This manufacturing method can manufacture a semiconductor device in which substantially the same resistance may act on the current flowing through the plurality of first semiconductor chips from the input end to the output end in the first parallel circuit. In this semiconductor device, the current flowing through the plurality of first semiconductor chips can be made uniform.

In one embodiment, the first parallel circuit may have the input end of the current thereto and the output end of the current therefrom on the same side in the arrangement direction of the plurality of first semiconductor chips. In this mode, in the step of mounting the plurality of semiconductor chips, the plurality of first semiconductor chips may be mounted on the circuit board such that the on-resistances of the plurality of first semiconductor chips decrease toward the side opposite to the input and output ends in the arrangement direction.

This structure makes it possible to manufacture a semiconductor device in which, regardless of the magnitudes of resistances of the first and second wiring conductors, substantially the same resistance may act on the current flowing through the plurality of first semiconductor chips from the input end to the output end in the first parallel circuit. In this semiconductor device, the current flowing through the plurality of first semiconductor chips can be made uniform.

One embodiment may further comprise the steps of inspecting an on-resistance of a plurality of second semiconductor chips; mounting the plurality of second semiconductor chips on the circuit board; and connecting the plurality of second semiconductor chips in parallel through the first and second wiring conductors such that the plurality of second semiconductor chips construct a second parallel circuit together with the first and second wiring conductors. In this mode, in the step of mounting the plurality of second semiconductor chips, the plurality of second semiconductor chips may be mounted on the circuit board according to the on-resistance of the plurality of second semiconductor chips so that a uniform current flows through the plurality of second semiconductor chips.

This structure makes it possible to manufacture a semiconductor device which allows the plurality of first semiconductor chips to let a current flow uniformly therethrough and the plurality of second semiconductor chips to let a current flow uniformly therethrough.

As mentioned above, a semiconductor device which allows a plurality of semiconductor chips to let a current flow uniformly therethrough and a method of manufacturing the same can be provided.

DETAILED DESCRIPTION

Figure 1:
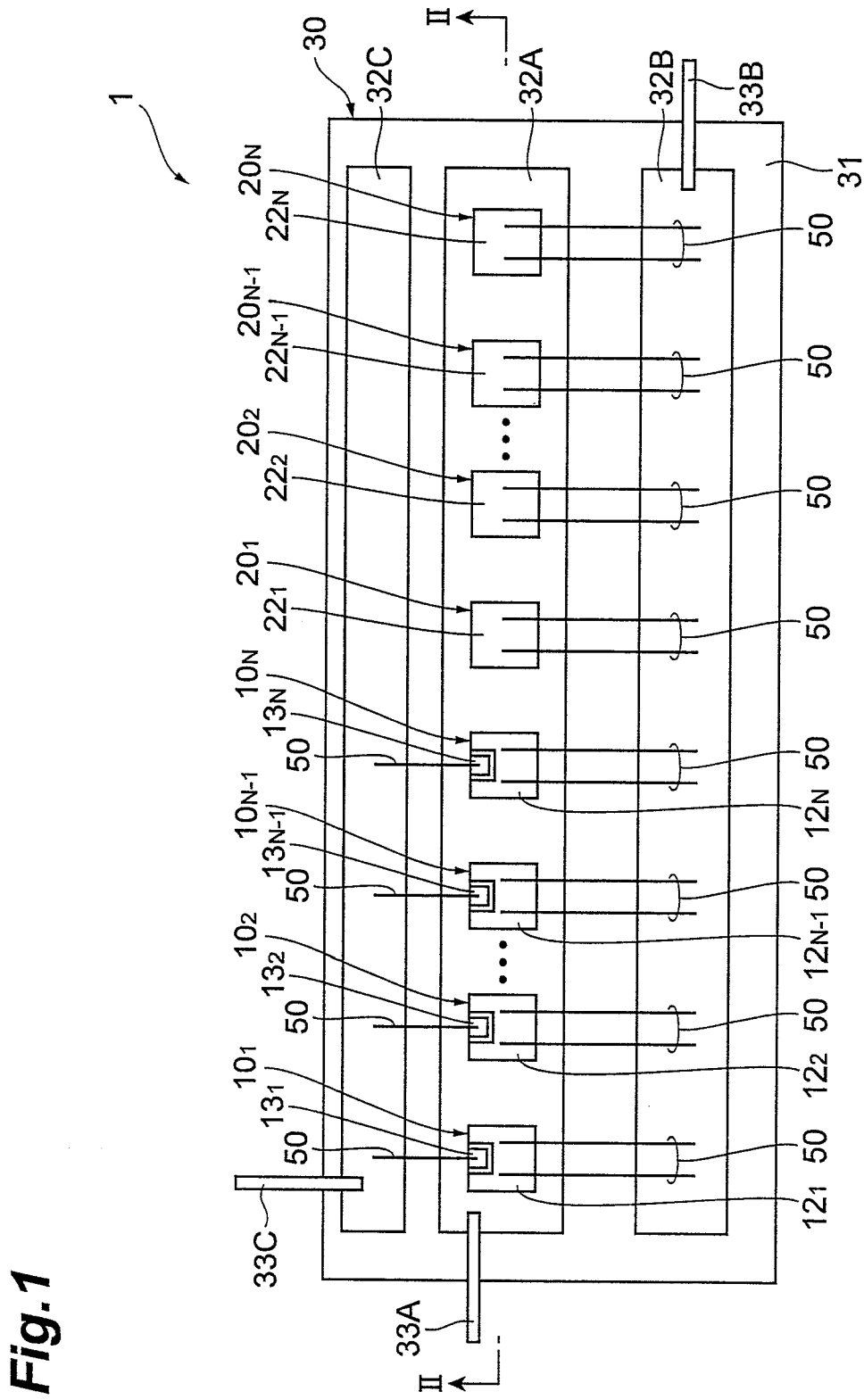
FIG. 1 is a diagram schematically illustrating a structure of a semiconductor device in accordance with a first embodiment.

In the following, embodiments of the present invention will be explained with reference to the drawings. In the explanation of the drawings, the same constituents will be referred to with the same signs while omitting their overlapping descriptions. Ratios of dimensions in the drawings do not always correspond to those explained. Terms such as "upper" and "lower" are used for convenience according to the states illustrated in the drawings.

Figure 2:
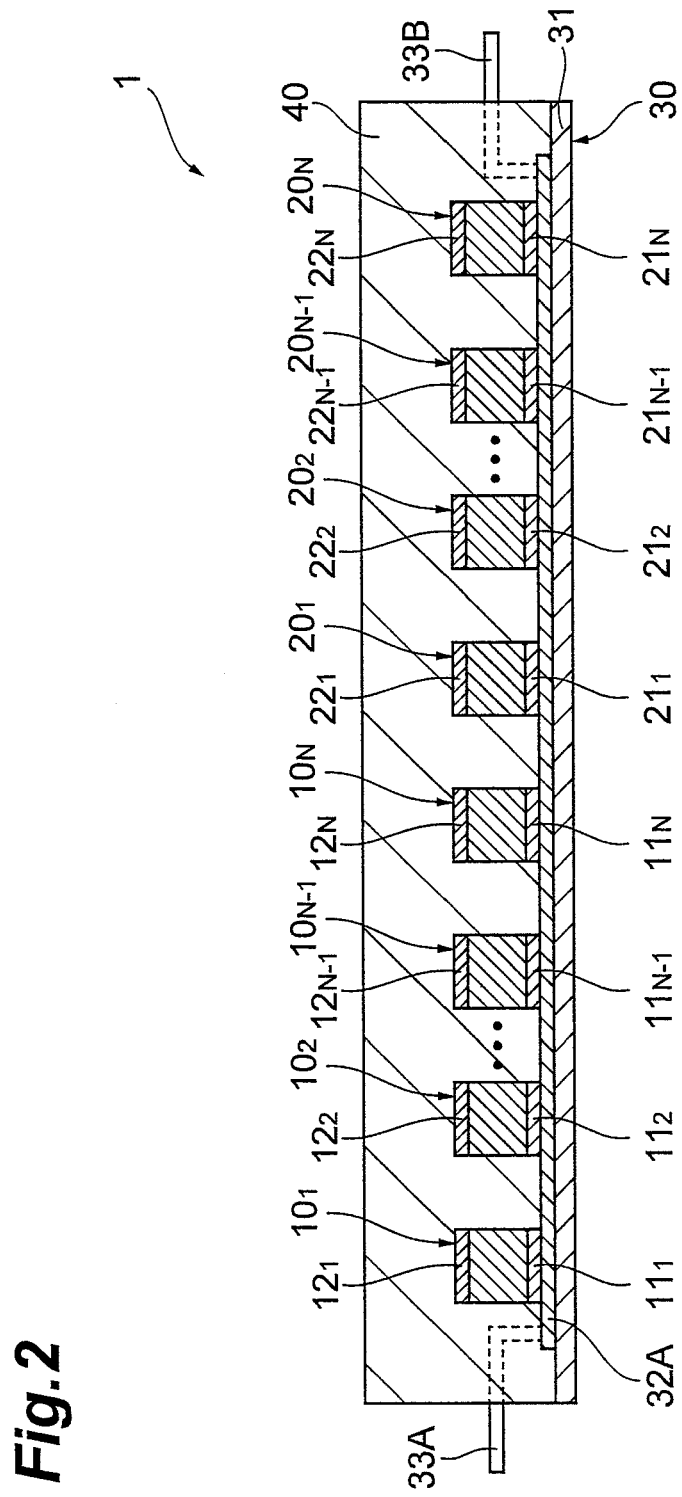
FIG. 2 is a diagram schematically illustrating a cross-sectional structure taken along the line II-II of FIG. 1.

FIG. 1 is a diagram schematically illustrating the structure of the semiconductor device in accordance with one embodiment. FIG. 1 schematically illustrates a structure of the semiconductor device as seen from the side mounted with semiconductor chips. FIG. 2 is a diagram schematically illustrating a cross-sectional structure taken along the line II-II of FIG. 1.

The semiconductor device 1 illustrated in FIG. 1 comprises first to Nth (where N is an integer of 2 or greater) transistors (first semiconductor chips) $10_1$ to $10_N$, first to Nth diodes (second semiconductor chips) $20_1$ to $20_N$, and a circuit board 30 mounted with the first to Nth transistors $10_1$ to $10_N$ and first to Nth diodes $20_1$ to $20_N$. In the following explanation, a given transistor in the first to Nth transistors $10_1$ to $10_N$ will also be referred to as a kth transistor $10_k$. Similarly, a given diode in the first to Nth diodes $20_1$ to $20_N$ will also be referred to as an ith diode $20_i$.

In one embodiment, as illustrated in FIG. 2, the semiconductor device 1 may be molded with a resin 40 so that the first to Nth transistors $10_1$ to $10_N$ and first to Nth diodes $20_1$ to $20_N$ are sealed for protecting the first to Nth diodes $20_1$ to $20_N$ and for moisture resistance. FIG. 1 omits the resin 40 in order to show the structure on the circuit board 30. Alternatively, the semiconductor device 1 may be equipped with a case for containing the circuit board 30 mounted with the first to Nth diodes $20_1$ to $20_N$.

The circuit board 30 has an insulating substrate 31 and three wiring conductors 32A, 32B, 32C formed on a surface (one surface) of the insulating substrate 31. The three wiring conductors 32A to 32C, each extending in one direction, are parallel to each other.

One end of a first electrode terminal unit 33A is connected to one end of the wiring conductor (first wiring conductor) 32A. One end of a second electrode terminal unit 33B is connected to one end of the wiring conductor (second wiring conductor) 32B. The second electrode terminal unit 33B is located on the side opposite to the first electrode terminal unit 33A in the extending direction of the wiring conductors 32A to 32C in the mode illustrated in FIG. 1. One end of a third electrode terminal unit 33C is connected to one end of the wiring conductor 32C.

The first to third electrode terminal units 33A to 33C are terminals for connecting the semiconductor device 1 to devices other than the semiconductor device 1, elements, circuits, or the like. When the semiconductor device 1 is closed with the resin 40 or a case, free ends of the first to third electrode terminal units 33A to 33C are drawn out of the semiconductor device 1 as illustrated in FIG. 2.

Examples of materials for the wiring conductors 32A, 32B, 32C include metals such as copper. The wiring conductors 32A, 32B, 32C are insulated. The wiring conductors 32A, 32B, 32C may be formed on the insulating substrate 31 by printing, for example.

The kth transistor $10_k$ is an insulated field-effect transistor (MOS-FET). The kth transistor $10_k$ may also be an insulated-gate bipolar transistor, a junction field-effect transistor, a junction bipolar transistor, or a thyristor. Examples of semiconductors employed for the kth transistor $10_k$ include wide-bandgap semiconductors such as SiC, GaN, and diamond and Si.

The kth transistor $10_k$ has first and second electrode units $11_k$, $12_k$ for supplying power to the kth transistor $10_k$ and a third electrode unit $13_k$ for controlling actions of the kth transistor $10_k$. In a mode where the kth transistor $10_k$ is a MOS-FET, the first, second, and third electrode units $11_k$, $12_k$, $13_k$ function as a drain, a source, and a gate, respectively.

Joining the first electrode unit $11_k$ onto the wiring conductor 32A by utilizing a conductive connection member (e.g., solder) secures the kth transistor $10_k$ onto the wiring conductor 32A. This electrically connects the kth transistor $10_k$ to the wiring conductor 32A. The second electrode unit $12_k$ is connected to the wiring conductor 32B through a wire 50. This electrically connects the second electrode unit $12_k$ of the kth transistor $10_k$ to the wiring conductor 32B. The third electrode unit $13_k$ is electrically connected to the wiring conductor 32C through a wire 50.

An example of the ith diode $20_i$ is a Schottky barrier diode. The ith diode $20_i$ has first and second electrode units $21_i$, $22_i$ for supplying power to the ith diode $20_i$. In this embodiment, the first and second electrode units $21_i$, $22_i$ function as a cathode and an anode, respectively. Examples of semiconductors employed for the ith diode $20_i$ include wide-bandgap semiconductors such as SiC, GaN, and diamond and Si.

Joining the first electrode unit $21_i$ onto the first wiring conductor 32A by utilizing a conductive connection member (e.g., solder) secures the ith diode $20_i$ onto the wiring conductor 32A. This electrically connects the ith diode $20_i$ to the wiring conductor 32A. The second electrode unit $22_i$ is connected to the wiring conductor 32B through a wire 50. This electrically connects the second electrode unit $22_i$ to the wiring conductor 32B.

In the connection relationship mentioned above, no current flows through the first to Nth diodes $20_1$ to $20_N$ when a current flows through the first to Nth transistors $10_1$ to $10_N$, whereas no current flows through the first to Nth transistors $10_1$ to $10_N$ when a current flows through the first to Nth diodes $20_1$ to $20_N$.

Hence, an equivalent circuit of the semiconductor device 1 in the case where the current flows through the first to Nth transistors $10_1$ to $10_N$ is represented by a first parallel circuit 60 constituted by the first to Nth transistors $10_1$ to $10_N$ and wiring conductors 32A, 32B, whereas an equivalent circuit of the semiconductor device 1 in the case where the current flows through the first to Nth diodes $20_1$ to $20_N$ is represented by a second parallel circuit 70 constituted by the first to Nth diodes $20_1$ to $20_N$ and wiring conductors 32A, 32B.

With reference to the first and second parallel circuits 60, 70, the states of arrangement of the first to Nth transistors $10_1$ to $10_N$ and first to Nth diodes $20_1$ to $20_N$ on the circuit board 30 will be explained.

Figure 3:
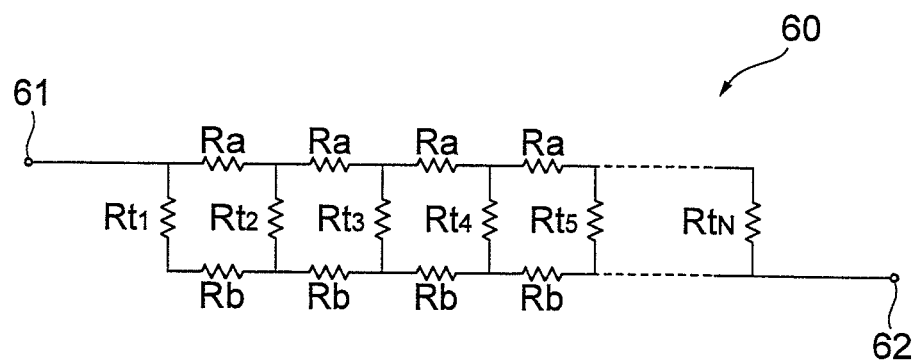
FIG. 3 is a diagram illustrating a first parallel circuit.

FIG. 3 is a diagram illustrating the first parallel circuit. FIG. 3 depicts a circuit in which the first parallel circuit 60 constructed by the wiring conductors 32A, 32B and first to Nth transistors $10_1$ to $10_N$ is schematically illustrated as being focused on resistances.

Resistances $Rt_1$ to $Rt_N$ indicate the respective on-resistances of the first to Nth transistors $10_1$ to $10_N$. In other words, the first to Nth transistors $10_1$ to $10_N$ are represented by the resistances $Rt_1$ to $Rt_N$ in FIG. 3.

Each resistance Ra in FIG. 3 represents the resistance between transistors adjacent to each other in the first to Nth transistors $10_1$ to $10_N$ in the wiring conductor 32A. Each resistance Rb represents the resistance between transistors adjacent to each other in the first to Nth transistors $10_1$ to $10_N$ in the wiring conductor 32B.

The first to Nth transistors $10_1$ to $10_N$ are arranged at equally-spaced intervals in their arrangement direction in FIGS. 1 and 3. Therefore, the adjacent transistors have the same resistance Ra therebetween. However, the resistance Ra, which is sensed by a current flowing through the wiring conductor 32A having conductivity, is minute. Therefore, even when the distance between the adjacent transistors varies, its resulting difference between a plurality of resistances Ra is negligible. Hence, the resistance Ra between the adjacent transistors will be assumed to be the same in the following explanation. The same holds for the resistance Rb between the adjacent transistors. In the following explanation, the resistances Ra and Rb will also be referred to as resistances of the wiring conductors 32A, 32B. The resistances Ra and Rb may vary depending on differences in widths and the like of the wiring conductors 32A, 32B even when they are made of the same material. In this embodiment, the resistances Ra and Rb have respective magnitudes different from each other.

The first parallel circuit 60 illustrated in FIG. 3 has an input end 61 of a current thereto and an output end 62 of the current therefrom. The output end 62 is located on the side opposite to the input end 61 in the arrangement direction of the first to Nth transistors $10_1$ to $10_N$ (the longitudinal direction of FIG. 3) in the first parallel circuit 60. The input and output ends 61, 62 correspond to the first and second electrode terminal units 33A, 33B in the structure of the semiconductor device 1 illustrated in FIG. 1, respectively.

In the first parallel circuit 60, parallel wirings to which the resistances $Rt_1$ to $Rt_N$ are connected correspond to the wiring conductors 32A, 32B. In the connection relationship of the first to Nth transistors $10_1$ to $10_N$ illustrated in FIG. 1, i.e., in the first parallel circuit 60 illustrated in FIG. 3, the current flows from the wiring conductor 32A side to the wiring conductor 32B side. Hence, with respect to the first to Nth transistors $10_1$ to $10_N$, the wiring conductor 32A in the wiring conductors 32A, 32B is the wiring conductor on the current supply side to the kth transistor $10_k$.

Figure 4:
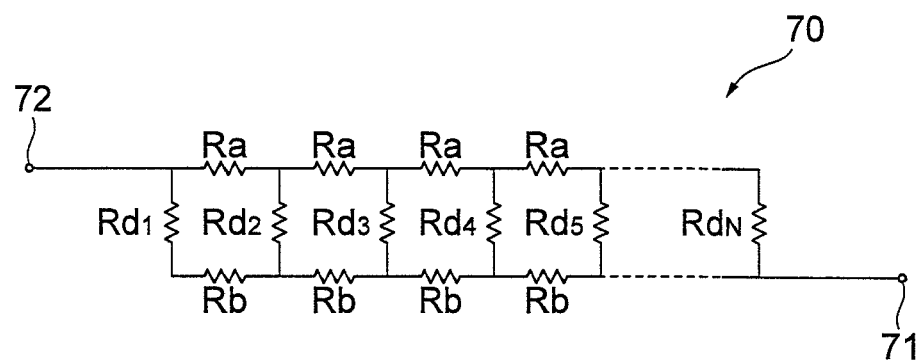
FIG. 4 is a diagram illustrating a second parallel circuit.

FIG. 4 is a diagram illustrating the second parallel circuit. FIG. 4 depicts a circuit in which the second parallel circuit 70 constructed by the wiring conductors 32A, 32B and first to Nth diodes $20_1$ to $20_N$ is schematically illustrated as being focused on resistances. Resistances $Rd_1$ to $Rd_N$ indicate the respective on-resistances of the first to Nth diodes $20_1$ to $20_N$. In other words, the first to Nth diodes $20_1$ to $20_N$ are represented by the resistances $Rd_1$ to $Rd_N$ in FIG. 4. Resistances Ra, Rb in FIG. 4 are resistances of the wiring conductors 32A, 32B as in FIG. 3.

The second parallel circuit 70 illustrated in FIG. 4 has an input end 71 of a current thereto and an output end 72 of the current therefrom. The output end 72 is located on the side opposite to the input end 71 in the arrangement direction of the first to Nth diodes $20_1$ to $20_N$ (the longitudinal direction of FIG. 4) in the second parallel circuit 70. The input and output ends 71, 72 correspond to the second and first electrode terminal units 33B, 33A in the structure of the semiconductor device 1 illustrated in FIG. 1, respectively.

In the second parallel circuit 70, parallel wirings to which the resistances $Rd_1$ to $Rd_N$ are connected correspond to the wiring conductors 32A, 32B. In the parallel connection relationship of the first to Nth diodes $20_1$ to $20_N$ illustrated in FIG. 1, i.e., in the second parallel circuit 70 illustrated in FIG. 4, the current flows from the wiring conductor 32B side to the wiring conductor 32A side. Hence, with respect to the first to Nth diodes $20_1$ to $20_N$, the wiring conductor 32B in the wiring conductors 32A, 32B is the wiring conductor on the current supply side to the ith diode $20_i$.

The first to Nth transistors $10_1$ to $10_N$ are arranged on the circuit board 30 so that a uniform current flows through the first to Nth transistors $10_1$ to $10_N$ according to the respective resistances Ra, Rb of the wiring conductors 32A, 32B and the on-resistances of the first to Nth transistors $10_1$ to $10_N$. Similarly, the first to Nth diodes $20_1$ to $20_N$ are arranged on the circuit board 30 so that a uniform current flows through the first to Nth diodes $20_1$ to $20_N$ according to the respective resistances Ra, Rb of the wiring conductors 32A, 32B and the on-resistances of the first to Nth diodes $20_1$ to $20_N$.

The orders of arrangement of the first to Nth transistors $10_1$ to $10_N$ and first to Nth diodes $20_1$ to $20_N$ will now be explained in the case where the resistance Ra is greater than the resistance Rb.

The fact that the resistance Ra is greater than the resistance Rb in the first parallel circuit 60, i.e., the resistance of the wiring conductor 32A is greater than that of the wiring conductor 32B, means that the resistance of the wiring (wiring conductor 32A) on the side supplying the current to the first to Nth transistors $10_1$ to $10_N$ in the parallel wirings of the first parallel circuit 60 is greater than that of the other wiring (wiring conductor 32B). In this case, the first to Nth transistors $10_1$ to $10_N$ are arranged such that their on-resistances decrease from the input end 61 side to the output end 62. In the structure illustrated in FIGS. 1 and 3, the first to Nth transistors $10_1$ to $10_N$ are arranged such that the first, second, third, . . . , and Nth transistors $10_1$, $10_2$, $10_3$, . . . , $10_N$ lower their on-resistances in this order from the input end 61 (first electrode terminal unit 33A) to the output end 62 (second electrode terminal unit 33B). That is, when Ra>Rb in the first parallel circuit 60 illustrated in FIG. 3, $Rt_1$>$Rt_2$>$Rt_3$ . . . >$Rt_N$ from the input end 61 side to the output end 62.

On the other hand, the fact that the resistance Ra is greater than the resistance Rb in the second parallel circuit 70, i.e., the resistance of the wiring conductor 32A is greater than that of the wiring conductor 32B, means that the resistance of the wiring (wiring conductor 32B) on the side supplying the current to the first to Nth diodes $20_1$ to $20_N$ in the parallel wirings of the second parallel circuit 70 is smaller than that of the other wiring (wiring conductor 32A). In this case, the first to Nth diodes $20_1$ to $20_N$ are arranged such that their on-resistances increase from the input end 71 side to the output end 72. In the structure illustrated in FIGS. 1 and 4, the first to Nth diodes $20_1$ to $20_N$ are arranged such that the Nth, (N−1)th, . . . , second, and first diodes $20_N$, $20_{N-1}$, . . . , $20_1$ enhance their on-resistances in this order from the input end 71 (second electrode terminal unit 33B) to the output end 72 (first electrode terminal unit 33A). That is, when Ra>Rb in the second parallel circuit 70 illustrated in FIG. 4, $Rd_1$>$Rd_2$> . . . >$Rd_N$ from the input end 71 side to the output end 72.

Next, the orders of arrangement of the first to Nth transistors $10_1$ to $10_N$ and first to Nth diodes $20_1$ to $20_N$ will be explained in the case where the resistance Ra is smaller than the resistance Rb.

The fact that the resistance Ra is smaller than the resistance Rb in the first parallel circuit 60, i.e., the resistance of the wiring conductor 32A is smaller than that of the wiring conductor 32B, means that the resistance of the wiring (wiring conductor 32A) on the side supplying the current to the first to Nth transistors $10_1$ to $10_N$ in the parallel wirings of the first parallel circuit 60 is smaller than that of the other wiring (wiring conductor 32B). In this case, the first to Nth transistors $10_1$ to $10_N$ are arranged such that their on-resistances increase from the input end 61 side to the output end 62. In the structure illustrated in FIGS. 1 and 3, the first to Nth transistors $10_1$ to $10_N$ are arranged such that the first, second, third, . . . , and Nth transistors $10_1$, $10_2$, $10_3$, . . . , $10_N$ enhance their on-resistances in this order from the input end 61 (first electrode terminal unit 33A) to the output end 62 (second electrode terminal unit 33B). That is, when Ra<Rb in the first parallel circuit 60 illustrated in FIG. 3, $Rt_1$<$Rt_2$< . . . <$Rt_N$ from the input end 61 side to the output end 62.

On the other hand, the fact that the resistance Ra is smaller than the resistance Rb in the second parallel circuit 70, i.e., the resistance of the wiring conductor 32A is smaller than that of the wiring conductor 32B, means that the resistance of the wiring (wiring conductor 32B) on the side supplying the current to the first to Nth diodes $20_1$ to $20_N$ in the parallel wirings of the second parallel circuit 70 is greater than that of the other wiring (wiring conductor 32A). In this case, the first to Nth diodes $20_1$ to $20_N$ are arranged such that their on-resistances decrease from the input end 71 side to the output end 72. In the structure illustrated in FIGS. 1 and 4, the first to Nth diodes $20_1$ to $20_N$ are arranged such that the Nth, (N−1)th, ..., second, and first diodes $20_N$, $20_{N-1}$, ..., $20_1$ lower their on-resistances in this order from the input end 71 (second electrode terminal unit 33B) to the output end 72 (first electrode terminal unit 33A). That is, when Ra<Rb in the second parallel circuit 70 illustrated in FIG. 4, $Rd_1 < Rd_2 < \ldots < Rd_N$ from the input end 71 side to the output end 72.

Figure 5:
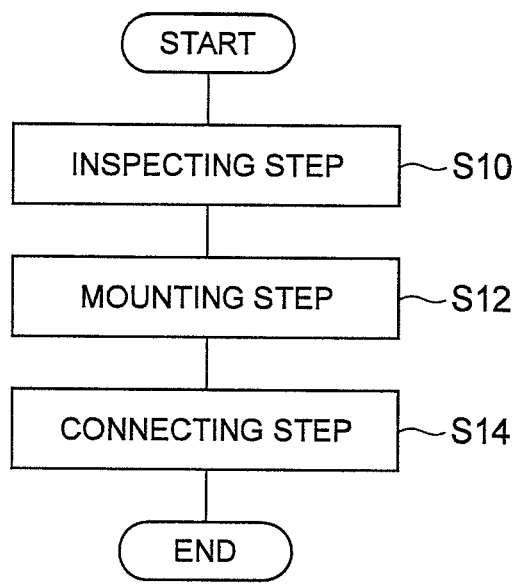
FIG. 5 is a flowchart illustrating an example of a method of manufacturing a semiconductor device.

A method of manufacturing the semiconductor device 1 will now be explained. FIG. 5 is a flowchart illustrating an example of the method of manufacturing a semiconductor device.

The on-resistances of the first to Nth transistors $10_1$ to $10_N$ and first to Nth diodes $20_1$ to $20_N$ in the semiconductor device 1 are inspected (inspecting step; step S10). How they are inspected is not restricted in particular as long as the on-resistances of the first to Nth transistors $10_1$ to $10_N$ and first to Nth diodes $20_1$ to $20_N$ can be detected. This inspection corresponds to tests for transistors and diodes which are typically performed when the first to Nth transistors $10_1$ to $10_N$ and first to Nth diodes $20_1$ to $20_N$ are manufactured.

Next, the first to Nth transistors $10_1$ to $10_N$ and first to Nth diodes $20_1$ to $20_N$ are mounted on the circuit board 30 (mounting step; step S12). Specifically, the first electrode unit $11_k$ of the kth transistor $10_k$ and the first electrode unit $21_i$ of the ith diode $20_i$ are secured onto the wiring conductor 32A through a conductive connection member.

When mounting the first to Nth transistors $10_1$ to $10_N$ and first to Nth diodes $20_1$ to $20_N$ on the circuit board 30, they are mounted on the circuit board 30 in the following arrangements.

The case where the resistance Ra of the wiring conductor 32A is greater than the resistance Rb of the wiring conductor 32B will now be explained.

Arrangement of the First to Nth Transistors $10_1$ to $10_N$

In the first parallel circuit 60 to be constructed by connecting the first to Nth transistors $10_1$ to $10_N$ in parallel to the wiring conductors 32A, 32B, the first to Nth transistors $10_1$ to $10_N$ are arranged on the circuit board 30 such that their on-resistances decrease in the direction from the input end 61 to the output end 62.

Arrangement of the First to Nth Diodes $20_1$ to $20_N$

In the second parallel circuit 70 to be constructed by connecting the first to Nth diodes $20_1$ to $20_N$ in parallel to the wiring conductors 32A, 32B, the first to Nth diodes $20_1$ to $20_N$ are arranged on the circuit board 30 such that their on-resistances increase in the direction from the input end 71 to the output end 72.

Next, the case where the resistance Ra of the wiring conductor 32A is smaller than the resistance Rb of the wiring conductor 32B will be explained.

Arrangement of the First to Nth Transistors $10_1$ to $10_N$

In the first parallel circuit 60 to be constructed by connecting the first to Nth transistors $10_1$ to $10_N$ in parallel to the wiring conductors 32A, 32B, the first to Nth transistors $10_1$ to $10_N$ are arranged on the circuit board 30 such that their on-resistances increase in the direction from the input end 61 to the output end 62.

Arrangement of the First to Nth Diodes $20_1$ to $20_N$

In the second parallel circuit 70 to be constructed by connecting the first to Nth diodes $20_1$ to $20_N$ in parallel to the wiring conductors 32A, 32B, the first to Nth diodes $20_1$ to $20_N$ are arranged on the circuit board 30 such that their on-resistances decrease in the direction from the input end 71 to the output end 72.

Thereafter, the second and third electrode units $12_k$, $13_k$ of the kth transistor $10_k$ are connected to the wiring conductors 32B, 32C through wires 50, respectively, so as to connect the first to Nth transistors $10_1$ to $10_N$ in parallel. Similarly, the second electrode unit $22_i$ of the ith diode $20_i$ is connected to the wiring conductor 32B with a wire 50, so as to connect the first to Nth diodes $20_1$ to $20_N$ in parallel (connecting step; step S14). The foregoing wiring constructs the first parallel circuit 60 when attention is focused on the first to Nth transistors $10_1$ to $10_N$, and the second parallel circuit 70 when attention is focused on the first to Nth diodes $20_1$ to $20_N$.

At the step S12, the input end 61 of the first parallel circuit 60 (or the output end 72 of the second parallel circuit 70) and the output end 62 of the first parallel circuit 60 (or the input end 71 of the second parallel circuit 70) may be positions designed on the semiconductor device 1 (hereinafter simply referred to as "designed positions"). In this case, for example, the first electrode terminal unit 33A functioning as the input and output ends 61, 72 and the second electrode terminal unit 33B functioning as the output and input ends 62, 71 may be electrically connected to the wiring conductors 32A, 32B so as to correspond to the designed positions after the step S14.

The step S12 may connect the first and second electrode terminal units 33A, 33B to the circuit board 30. The circuit board 30 connected to the first and second electrode terminal units 33A, 33B may be prepared beforehand.

When the resistances Ra, Rb of the wiring conductors 32A, 32B can be calculated theoretically from the resistance values (e.g., resistance value per unit length or unit cross-sectional area) intrinsic to materials constituting the wiring conductors 32A, 32B, sizes (e.g., widths) of the wiring conductors 32A, 32B, and the like, thus calculated values may be used in one embodiment. In another embodiment, the resistances Ra, Rb of the wiring conductors 32A, 32B may actually be measured at the step S10 or S12 or between the steps S10 and S12, and thus measured values may be utilized.

Though the processing operations for the first to Nth transistors $10_1$ to $10_N$ and first to Nth diodes $20_1$ to $20_N$ are explained collectively in each of the above-mentioned inspecting, mounting, and connecting steps, the inspecting, mounting, and connecting steps for the first to Nth transistors $10_1$ to $10_N$ may be performed separately from those for the first to Nth diodes $20_1$ to $20_N$.

Figure 6:
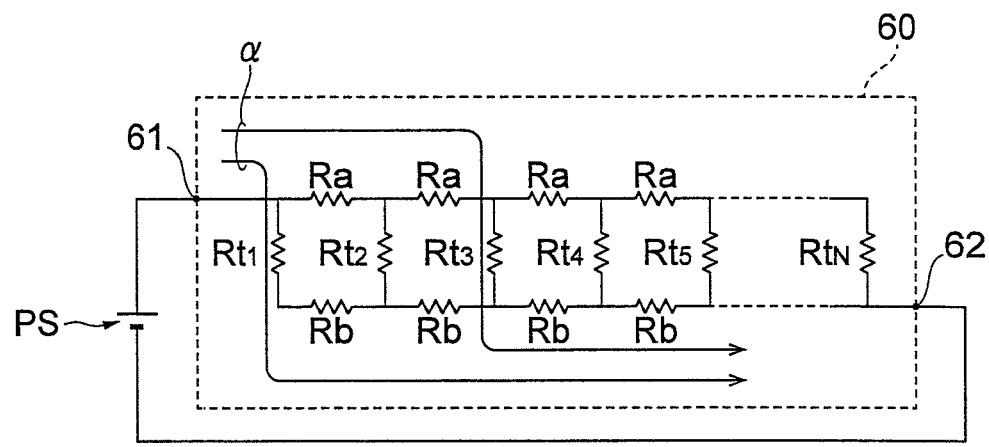
FIG. 6 is a diagram illustrating an example of modes of connecting a power supply source for supplying power to the first parallel circuit illustrated in FIG. 3 and the first parallel circuit.

FIG. 6 is a diagram illustrating an example of modes of connecting a power supply source for supplying power to the first parallel circuit illustrated in FIG. 3 and the first parallel circuit. FIG. 6 depicts a power supply source as a DC power supply PS. In FIG. 6, the anode and cathode of the DC power supply PS are electrically connected to the input end 61 (first electrode terminal unit 33A) and output end 62 (second electrode terminal unit 33B), respectively.

In this structure, a current flows in directions of arrows α illustrated in FIG. 6. Therefore, the value of resistance acting on (or sensed by) the current flowing through a resistance $R_k$, i.e., the current flowing through the kth transistor $10_k$, is $(k-1) \times Ra + (N-1-k) \times Rb + R_k$. When Ra>Rb, the first to Nth transistors $10_1$ to $10_N$ are arranged such that $Rt_1 > Rt_2 > \ldots > Rt_N$ in the first parallel circuit 60, which is the equivalent circuit of the semiconductor device 1. When Ra<Rb, on the other hand, the first to Nth transistors $10_1$ to $10_N$ are arranged such that $Rt_1 < Rt_2 < \ldots < Rt_N$ in the first parallel circuit 60. Therefore, when the current flows from the input end 61 to the output end 62, the value of resistance acting on the current becomes more uniform in the path of the current flowing through the first to Nth transistors $10_1$ to $10_N$. As a result, the current flowing through the first to Nth transistors $10_1$ to $10_N$ can be homogenized.

Hence, even when the on-resistances vary among the first to Nth transistors $10_1$ to $10_N$, a large current exceeding the rated current value of a transistor having a smaller on-resistance is less likely to flow into and destroy this transistor.

The foregoing explanation concerning the first parallel circuit 60 also holds for the second parallel circuit 70. That is, even when the on-resistances vary among the first to Nth diodes $20_1$ to $20_N$, a large current exceeding the rated current value of a diode having a smaller on-resistance is less likely to flow into and destroy this diode.

Therefore, when in action, the semiconductor device 1 having the first to Nth transistors $10_1$ to $10_N$ and first to Nth diodes $20_1$ to $20_N$ is less likely to break and thus improves its reliability.

When the first to Nth transistors $10_1$ to $10_N$ are manufactured, their on-resistance may vary. The same holds for the first to Nth diodes $20_1$ to $20_N$. In the semiconductor device manufacturing method explained with reference to FIG. 5, the step S10 inspects the on-resistances of the first to Nth transistors $10_1$ to $10_N$ and first to Nth diodes $20_1$ to $20_N$. Then, while taking account of variations in the on-resistances, the first to Nth transistors $10_1$ to $10_N$ and first to Nth diodes $20_1$ to $20_N$ are arranged on the circuit board 30 as illustrated according to the on-resistances of the first to Nth transistors $10_1$ to $10_N$ and first to Nth diodes $20_1$ to $20_N$ as well as the resistances of the wiring conductors 32A, 32B, so as to manufacture the semiconductor device 1. This manufactures the semiconductor device 1 in which more uniform currents flow through the first to Nth transistors $10_1$ to $10_N$ and the first to Nth diodes $20_1$ to $20_N$.

This embodiment utilizes the resistance difference between the wiring conductors 32A, 32B. Such a difference may occur because of a difference between the widths of the wiring conductors 32A, 32B according to currents flowing through the wiring conductors 32A, 32B and positions where the first to Nth transistors $10_1$ to $10_N$ and first to Nth diodes $20_1$ to $20_N$ are placed. However, taking account of variations in the on-resistances, the widths of the wiring conductors 32A, 32B may be adjusted to yield a resistance difference so that the first to Nth transistors $10_1$ to $10_N$ and first to Nth diodes $20_1$ to $20_N$ can be arranged in any of the predetermined orders explained in the foregoing. The widths of the wiring conductors 32A, 32B are their lengths orthogonal to their extending direction in FIG. 1.

Currently, semiconductor chips utilizing wide-bandgap semiconductors such as SiC and GaN have small capacities with low rated current values due to manufacturing techniques and the like. Therefore, when letting a large current flow through a semiconductor device utilizing wide-bandgap semiconductor chips, for example, it is necessary to connect a plurality of transistors in parallel and a plurality of diodes in parallel. Hence, a structure in which a uniform current flows through a plurality of transistors while a uniform current flows through a plurality of diodes according to the on-resistances of the transistors and diodes and the resistances of the wiring conductors 32A, 32B as explained in the foregoing is a particularly effective structure in a semiconductor device equipped with semiconductor chips utilizing wide-bandgap semiconductors.

Second Embodiment

Figure 7:
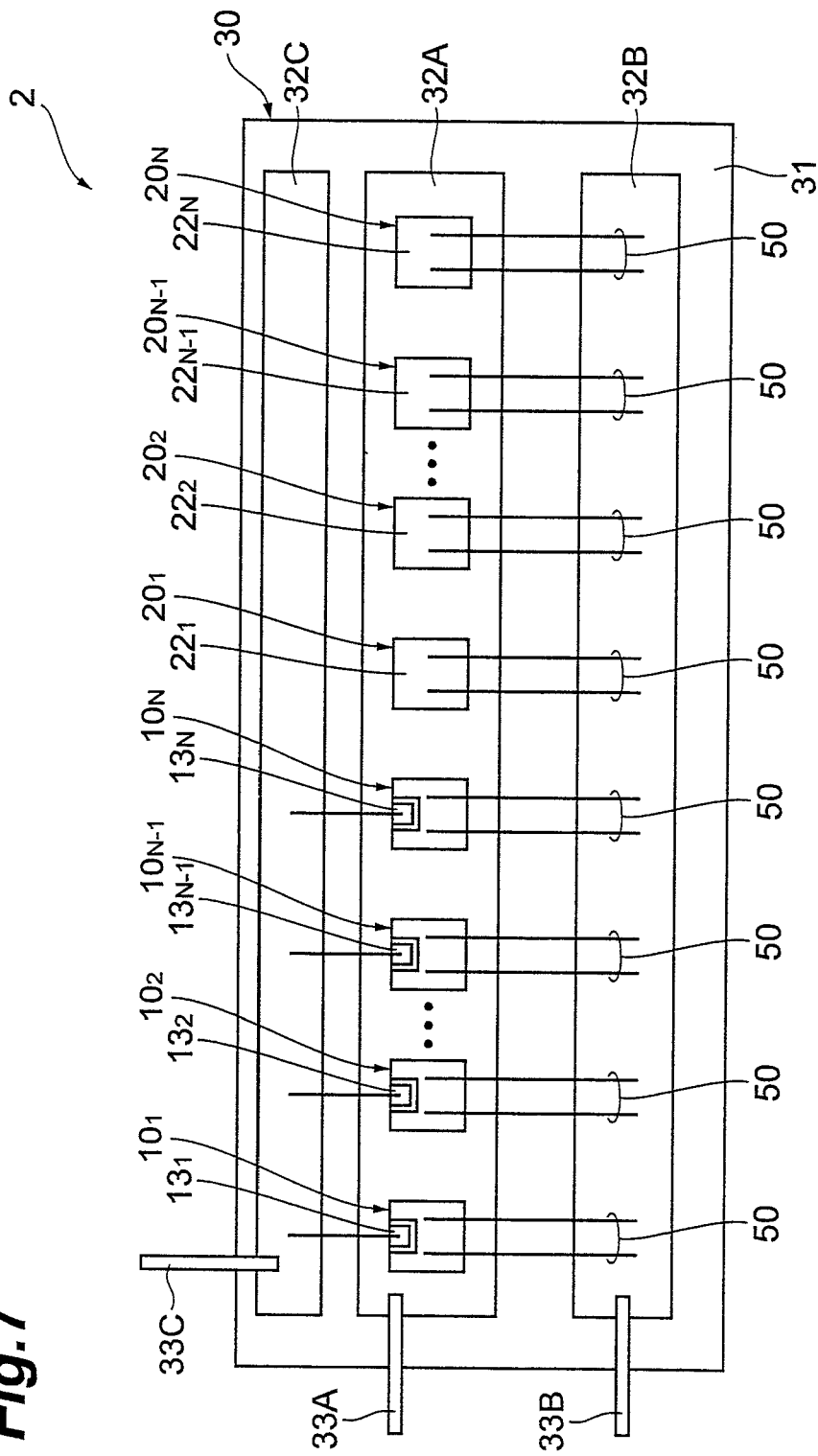
FIG. 7 is a diagram schematically illustrating a structure of a semiconductor device in accordance with a second embodiment.

FIG. 7 is a diagram schematically illustrating the structure of the semiconductor device in accordance with the second embodiment.

This semiconductor device 2 differs from the structure of the semiconductor device 1 illustrated in FIG. 1 mainly in that the second electrode terminal unit 33B is located on the same side as the first electrode terminal unit 33A in the extending direction of the wiring conductors 32A to 32C. The semiconductor device 2 will be explained as being focused on this difference.

Figure 8:
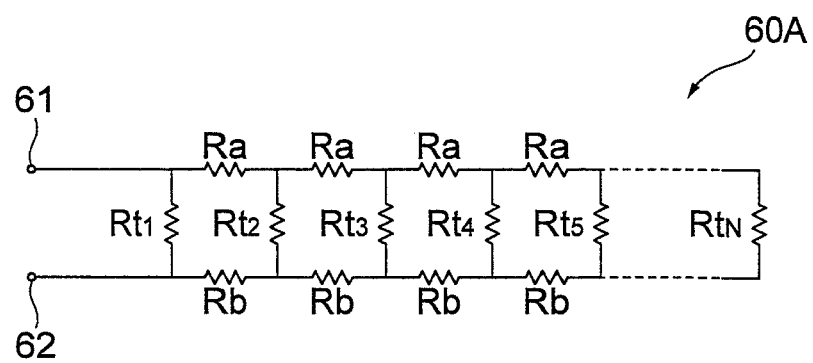
FIG. 8 is a diagram illustrating the first parallel circuit in the second embodiment.
Figure 9:
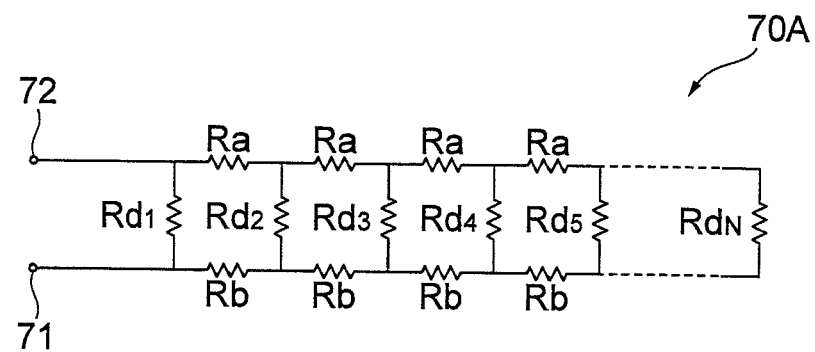
FIG. 9 is a diagram illustrating the second parallel circuit in the second embodiment.

FIG. 8 is a diagram illustrating a first parallel circuit 60A constructed by the first to Nth transistors $10_1$ to $10_N$ and wiring conductors 32A, 32B in the semiconductor device 2. FIG. 9 is a diagram illustrating a second parallel circuit 70A constructed by the first to Nth diodes $20_1$ to $20_N$ and wiring conductors 32A, 32B in the semiconductor device 2. The circuits illustrated in FIGS. 8 and 9 are those focused on resistances as in FIGS. 3 and 4.

As illustrated in FIG. 8, input and output ends 61, 62 are located on the same side in the arrangement direction of the first to Nth transistors $10_1$ to $10_N$ of the first parallel circuit 60A (longitudinal direction of FIG. 8). In this structure, the first to Nth transistors $10_1$ to $10_N$ are arranged such that their on-resistances decrease from the input end 61 (or output end 62) side to the opposite side.

In FIG. 9, input and output ends 71, 72 are located on the same side in the arrangement direction of the first to Nth diodes $20_1$ to $20_N$ of the second parallel circuit 70A (longitudinal direction of FIG. 9) as in FIG. 8. Therefore, as in FIG. 8, the first to Nth diodes $20_1$ to $20_N$ are arranged such that their on-resistances decrease from the input end 71 (or output end 72) side to the opposite side.

The semiconductor device 2 can be manufactured by utilizing the orders of arrangement explained with reference to FIGS. 8 and 9 as the orders of arrangement of the first to Nth transistors $10_1$ to $10_N$ and first to Nth diodes $20_1$ to $20_N$ at the step S12 illustrated in FIG. 5.

Figure 10:
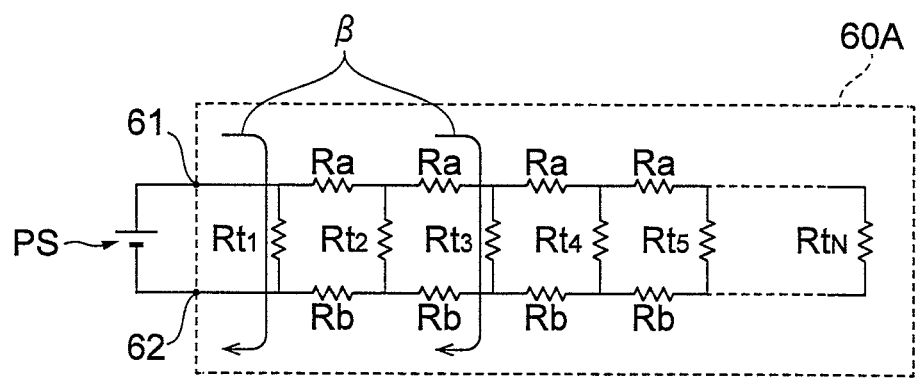
FIG. 10 is a circuit diagram illustrating an example of connection relationships between a power supply unit and the circuit depicted in FIG. 8.

FIG. 10 is a circuit diagram illustrating an example of connection relationships between a power supply unit and the circuit depicted in FIG. 8. FIG. 10 depicts the power supply unit as a DC power supply PS as in FIG. 6. The anode and cathode of the DC power supply PS are electrically connected to the input end 61 and output end 62, respectively.

In the circuit illustrated in FIG. 10, a current flows in directions of arrows β indicated therein. Only a resistance $Rt_1$ acts on (or sensed by) the current flowing through the resistance $Rt_1$, i.e., the first transistor $10_1$. On the other hand, the resistance acting on (or sensed by) the current flowing through the resistance Rm (where m is any number of 2 to N), i.e., the mth transistor $10_m$, for example, is $(m-1) \times Ra + (m-1) \times Rb + Rt_m$.

In the semiconductor device 2, the first to Nth transistors $10_1$ to $10_N$ are arranged such that their on-resistances decrease from the input end 61 (or output end 62) side to the opposite side in the first parallel circuit 60A. This makes it easier for the current to flow from the input end 61 (or output end 62) side to the opposite side as well. As a result, the current flowing through the first to Nth transistors $10_1$ to $10_N$ can be homogenized.

The foregoing explanation concerning the first parallel circuit 60A when the current flows through the first to Nth transistors $10_1$ to $10_N$ also holds for the second parallel circuit 70A. That is, the current flowing through the first to Nth diodes $20_1$ to $20_N$ can be homogenized in the second parallel circuit 70A.

Therefore, the semiconductor device 2 and method of manufacturing the same have at least the same operations and effects as those of the semiconductor device 1 and method of manufacturing the same explained in the first embodiment. The structure of the semiconductor device 2 can arrange the first to Nth transistors $10_1$ to $10_N$ and first to Nth diodes $20_1$ to $20_N$ according to their on-resistances regardless of the difference in resistance between the wiring conductors 32A, 32B. Hence, the semiconductor device 2 can be designed easily.

The present invention is not restricted to its embodiments explained in the foregoing but may be modified variously within a scope not deviating from the gist of the present invention.

The foregoing has explained the first and second semiconductor chips as a transistor and a diode, respectively. However, these are for convenience of explanation; the first and second semiconductor chips may be a diode and a transistor, respectively. The first and second semiconductor chips are not limited to diodes and transistors as long as they are semiconductor chips having on-resistances.

Figure 11:
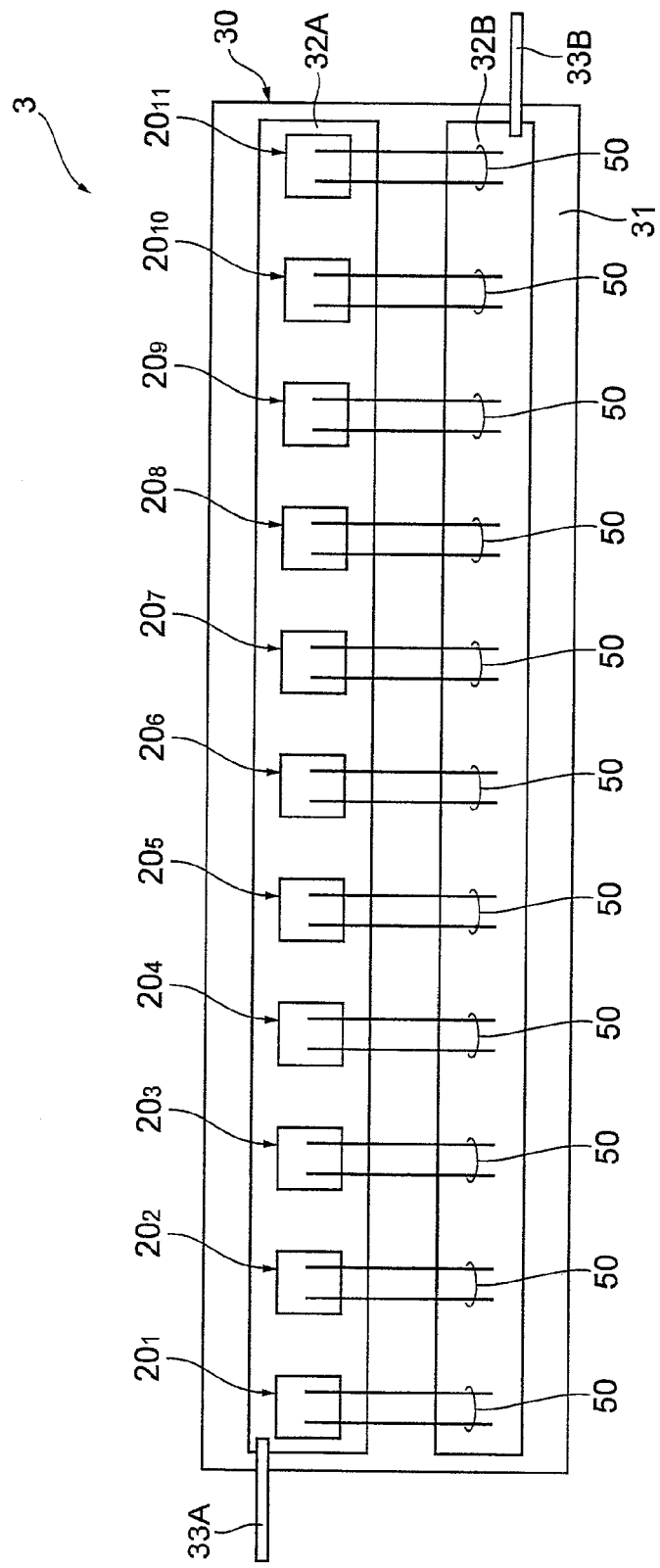
FIG. 11 is a schematic view of another embodiment of the semiconductor device.

It is sufficient for the semiconductor device to have the first to Nth transistors $10_1$ to $10_N$ or the first to Nth diodes $20_1$ to $20_N$. FIG. 11 is a schematic view of another embodiment of the semiconductor device. The semiconductor device 3 illustrated in FIG. 11 is a semiconductor device comprising the first to Nth diodes $20_1$ to $20_N$ without the first to Nth transistors $10_1$ to $10_N$. FIG. 11 illustrates a case where N=11.

As illustrated in FIG. 11, the circuit board in the semiconductor device 3 does not necessarily include the wiring conductor 32C as long as it has the wiring conductors 32A, 32B. An equivalent circuit of the semiconductor device 3 focused on its resistances corresponds to the second parallel circuit 70 illustrated in FIG. 4. The order of arrangement of the first to Nth diodes $20_1$ to $20_N$ is the same as with the case illustrated in FIGS. 1 and 4.

The semiconductor device 3 illustrated in FIG. 11 corresponds to the structure free of the first to Nth transistors $10_1$ to $10_N$ in the semiconductor device illustrated in FIG. 1. However, the semiconductor device 3 may have a structure which is free of the first to Nth transistors $10_1$ to $10_N$ in the semiconductor device 2 illustrated in FIG. 7. The semiconductor device may also have a structure comprising the first to Nth transistors $10_1$ to $10_N$ without the first to Nth diodes $20_1$ to $20_N$ in the semiconductor devices 1, 2 illustrated in FIGS. 1 and 7.

Various embodiments have been explained by illustrating a mode in which the first to Nth transistors $10_1$ to $10_N$ and first to Nth diodes $20_1$ to $20_N$ are disposed on the wiring conductor 32A. However, the first to Nth transistors $10_1$ to $10_N$ may be disposed on the wiring conductor 32B as long as they can construct the first parallel circuit through the wiring conductors 32A, 32B in the circuit board 30. The same holds for the first to Nth diodes $20_1$ to $20_N$.

For example, the wiring conductor 32B may be formed on the surface opposite to that formed with the wiring conductor 32A in the insulating substrate 31 as long as the first to Nth diodes $20_1$ to $20_N$ can be connected in parallel through the wiring conductors 32A, 32B. The same holds for the case where the semiconductor device comprises the first to Nth transistors $10_1$ to $10_N$.

Though the number of transistors is the same as that of diodes in the semiconductor devices 1, 2, they may differ from each other. It is not always necessary for the semiconductor devices 1, 2, 3 to comprise the first and second electrode terminal units 33A, 33B as long as terminals of devices and circuits other than the semiconductor devices 1, 2, 3, elements, and the like are electrically connected to the wiring conductors 32A, 32B when using the semiconductor devices 1, 2, 3, so that currents can be fed from and to the wiring conductors 32A, 32B.

In the semiconductor devices 1 to 3, the wiring conductors 32A, 32B extend in one direction and are parallel to each other. However, forms and the like of the wiring conductors 32A, 32B are not restricted in particular as long as a plurality of first semiconductor chips and a plurality of second semiconductor chips are disposed in the illustrated orders of arrangement in the first and second parallel circuits.

Various embodiments and modified examples explained in the foregoing may be combined with each other, and one embodiment or modified example may be applied to another embodiment.

What is claimed is:

1. A semiconductor device comprising:
   a plurality of first semiconductor chips; and
   a circuit board, mounted with the plurality of the first semiconductor chips, having first and second wiring conductors electrically connected to the plurality of first semiconductor chips;
   wherein the plurality of first semiconductor chips are connected in parallel together with the first and second wiring conductors so as to construct a first parallel circuit; and
   wherein the plurality of first semiconductor chips are arranged on the circuit board according to an on-resistance of the plurality of first semiconductor chips so that a uniform current flows through the plurality of first semiconductor chips.

2. A semiconductor device according to claim 1, wherein input and output ends of the current for the first parallel circuit are opposite to each other in an arrangement direction of the plurality of first semiconductor chips in the first parallel circuit;
   wherein the first and second wiring conductors have respective resistances different from each other;
   wherein, when the wiring conductor on the current supply side for the plurality of first semiconductor chips in the first and second wiring conductors has a resistance greater than that of the other wiring conductor, the on-resistances of the plurality of first semiconductor chips decrease from the input end side to the output end side in the first parallel circuit; and
   wherein, when the wiring conductor on the current supply side for the plurality of first semiconductor chips in the first and second wiring conductors has a resistance smaller than that of the other wiring conductor, the on-resistances of the plurality of first semiconductor chips increase from the input end side to the output end side in the first parallel circuit.

3. A semiconductor device according to claim 1, wherein input and output ends of the current for the first parallel circuit are on the same side in the arrangement direction of the plurality of first semiconductor chips in the first parallel circuit; and
   wherein the on-resistances of the plurality of first semiconductor chips decrease toward the side opposite to the input and output ends in the arrangement direction in the first parallel circuit.

4. A semiconductor device according to claim 1, wherein a semiconductor constituting the plurality of first semiconductor chips is a wide-bandgap semiconductor.

5. A semiconductor device according to claim 1, wherein the first semiconductor chip is a diode or transistor.

6. A semiconductor device according to claim 1, further comprising a plurality of second semiconductor chips;
   wherein the plurality of second semiconductor chips are connected in parallel together with the first and second wiring conductors so as to construct a second parallel circuit; and
   wherein the plurality of second semiconductor chips are arranged on the circuit board according to an on-resistance of the plurality of second semiconductor chips so that a uniform current flows through the plurality of second semiconductor chips.

7. A semiconductor device according to claim 6, wherein one of the first and second semiconductor chips is a transistor, while the other is a diode.

8. A method of manufacturing a semiconductor device, the method comprising the steps of:
inspecting an on-resistance of a plurality of first semiconductor chips;
mounting the plurality of first semiconductor chips on a circuit board having a first wiring conductor and a second wiring conductor insulated from the first wiring conductor; and
connecting the plurality of first semiconductor chips in parallel through the first and second wiring conductors such that the plurality of first semiconductor chips construct a first parallel circuit together with the first and second wiring conductors;
wherein, in the step of mounting the plurality of first semiconductor chips, the plurality of first semiconductor chips are mounted on the circuit board according to the on-resistance of the plurality of first semiconductor chips so that a uniform current flows through the plurality of first semiconductor chips.

9. A method of manufacturing a semiconductor device according to claim 8, wherein the first parallel circuit has an output end of the current therefrom on a side opposite to an input end of the current thereto in an arrangement direction of the plurality of first semiconductor chips;
wherein the first and second wiring conductors have respective resistances different from each other;
wherein, in the step of mounting the plurality of semiconductor chips,
when the wiring conductor to be located on the current supply side for the plurality of first semiconductor chips in the first and second wiring conductors has a resistance greater than that of the other wiring conductor, the plurality of first semiconductor chips are mounted on the circuit board such that the on-resistances of the plurality of first semiconductor chips decrease from the input end side to the output end side; and
when the wiring conductor to be located on the current supply side for the plurality of first semiconductor chips in the first and second wiring conductors has a resistance smaller than that of the other wiring conductor, the plurality of first semiconductor chips are mounted on the circuit board such that the on-resistances of the plurality of first semiconductor chips increase from the input end side to the output end side.

10. A method of manufacturing a semiconductor device according to claim 8, wherein the first parallel circuit has an input end of the current thereto and an output end of the current therefrom on the same side in an arrangement direction of the plurality of first semiconductor chips; and
wherein, in the step of mounting the plurality of semiconductor chips, the plurality of first semiconductor chips are mounted on the circuit board such that the on-resistances of the plurality of first semiconductor chips decrease toward the side opposite to the input and output ends in the arrangement direction.

11. A method of manufacturing a semiconductor device according to claim 8, further comprising the steps of:
inspecting an on-resistance of a plurality of second semiconductor chips;
mounting the plurality of second semiconductor chips on the circuit board; and
connecting the plurality of second semiconductor chips in parallel through the first and second wiring conductors such that the plurality of second semiconductor chips construct a second parallel circuit together with the first and second wiring conductors;
wherein, in the step of mounting the plurality of second semiconductor chips, the plurality of second semiconductor chips are mounted on the circuit board according to the on-resistance of the plurality of second semiconductor chips so that a uniform current flows through the plurality of second semiconductor chips.

* * * * *